United States Patent [19]
Schaper et al.

[11] Patent Number: 5,802,856
[45] Date of Patent: Sep. 8, 1998

[54] MULTIZONE BAKE/CHILL THERMAL CYCLING MODULE

[75] Inventors: Charles D. Schaper, Union City; Khalid A. El-Awady, Mountain View; Thomas Kailath, Stanford, all of Calif.

[73] Assignee: Stanford University, Stanford, Calif.

[21] Appl. No.: 903,716

[22] Filed: Jul. 31, 1997

Related U.S. Application Data

[63] Continuation-in-part of Ser. No. 688,909, Jul. 31, 1996, abandoned.

[51] Int. Cl.[6] .................................................... F25B 21/02
[52] U.S. Cl. ............................ 62/3.7; 62/3.3; 165/206; 118/724; 392/416; 392/418
[58] Field of Search .................................. 62/3.2, 3.3, 3.7, 62/177, 179, 180, 331; 165/206; 118/724, 725; 219/390, 405, 411; 392/418, 416

[56] References Cited

U.S. PATENT DOCUMENTS 5,343,012  8/1994  Hardy et al. ............................ 392/418
5,567,267  10/1996  Kazama et al. ......................... 118/724
5,602,756  2/1997  Atwood et al. ......................... 364/500

Primary Examiner—John M. Sollecito
Attorney, Agent, or Firm—Lumen Intellectual Property Services

[57] ABSTRACT

A thermal cycling module includes an array of thermoelectric devices [36] divided into multiple zones [A, B, C, D] independently controlled by corresponding variable power supplies [56, 58, 60, 62]. The thermoelectric devices [36] provide localized, precise, and rapid control of both heating and cooling, while fluid from one of several fluid supplies [64, 66, 68] provides bulk heating or cooling via a fluid heat exchanger [38]. Sensors [46, 48, 50, 52] provide feedback of temperature or other process parameters to a controller [54] which generates control signals for controlling the power supplies [56, 58, 60, 62], the fluid supplies [64, 66, 68], and fluid valves [70, 72] which control fluid flow through the heat exchanger [38].

54 Claims, 14 Drawing Sheets

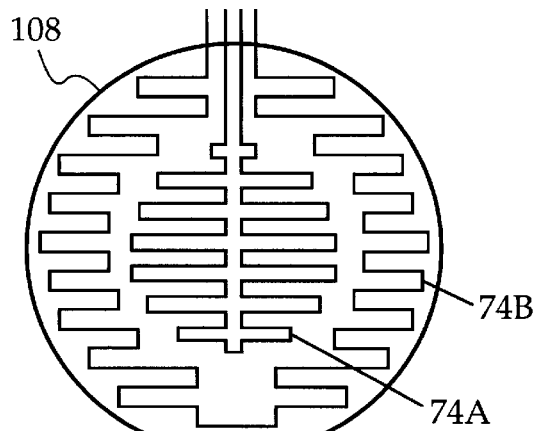
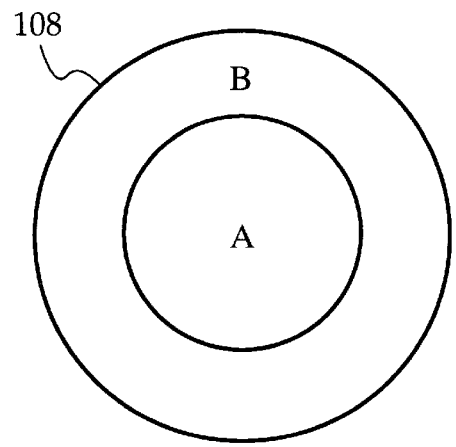
FIG. 17  FIG. 18
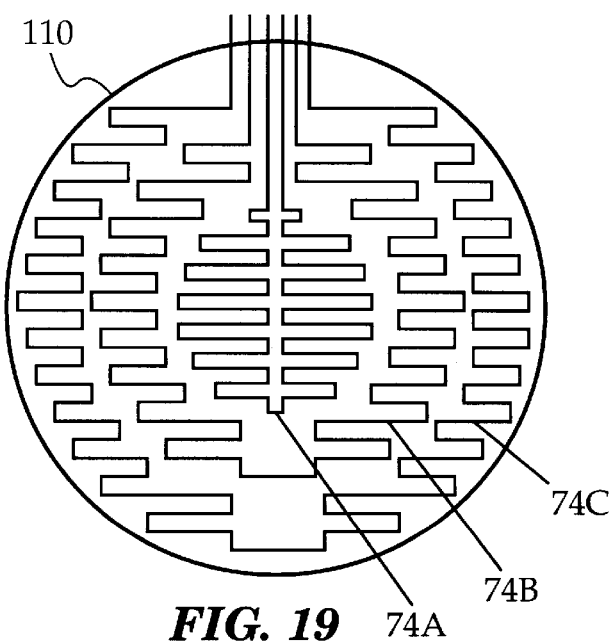
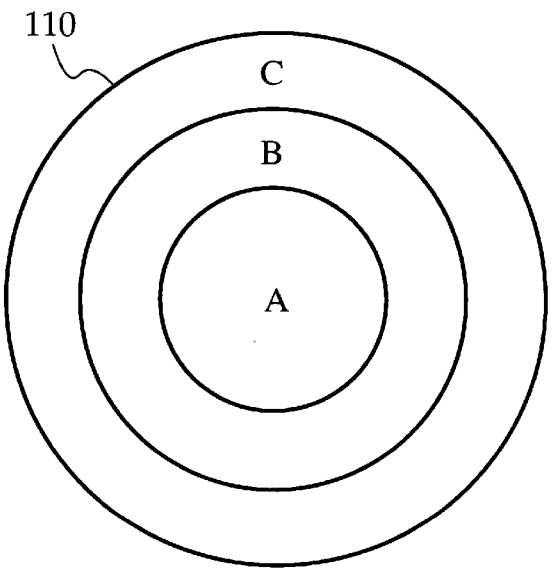
FIG. 19  FIG. 20

MULTIZONE BAKE/CHILL THERMAL CYCLING MODULE

RELATED APPLICATION INFORMATION

This application is a continuation in part of application Ser. No. 08/688,909 filed Jul. 31, 1996 now abandoned, which is hereby incorporated by reference.

This invention was supported in part by grant number F49620-95-1-0525 of the Defense Advanced Research Projects Agency (DARPA). The U.S. Government has certain rights in the invention.

TECHNICAL FIELD OF THE INVENTION

This invention relates generally to devices and methods for providing integrated bake/chill thermal cycling. More particularly, it relates to multizone bake/chill modules for providing controlled thermal cycling of material substrates such as semiconductor wafers and flat panel displays.

BACKGROUND OF THE INVENTION

The photoresist processing stage of manufacturing a semiconductor wafer involves baking the wafer and subsequently chilling it. In order to produce high quality wafers suitable for present integrated circuit applications, the temperature of the wafer during this thermal cycling must be controlled to a high degree of precision in both time and space.

FIG. 1 shows the conventional method for baking and chilling semiconductor wafers. The bake and chill steps are performed by placing a substrate 20, usually a semiconductor wafer, on a hot plate 22 where it is baked at a temperature typically between 70° and 250° C. for a period of time typically between 45 s and 90 s. The wafer is then mechanically moved to a cold plate 24 where it is chilled to a temperature typically between 0° and 30° C.

This conventional method for baking and chilling semiconductor wafers has several disadvantages. First, the movement of the wafer through the air from the hot plate to the cold plate causes the wafer to experience uncontrolled and nonuniform temperature fluctuations. Second, uncontrolled temperature nonuniformities during the bake or chill steps may arise from convection currents or from warping of the substrate. Third, the time required to move the wafer between the plates prevents the realization of very short thermal transition times between the bake and chill steps. Fourth, the mechanical movement of the wafer between the plates may contaminate or otherwise damage the wafer.

U.S. Pat. No. 5,431,700 issued to Sloan on Jul. 11, 1995 discloses an apparatus which attempts to overcome some of these disadvantages. Rather than placing the hot plate beside the cold plate as shown in FIG. 1, the apparatus has a hot plate 26 placed upside down and directly above a cold plate 28, as shown in FIG. 2. Because a wafer 30 needs to move only a short distance from the cold plate directly upward to the hot plate, the apparatus of Sloan reduces the uncontrolled and nonuniform temperature fluctuations during the movement between the bake and chill steps. Nevertheless, because the wafer must be moved between separate bake and chill plates, it still experiences uncontrolled and nonuniform temperature fluctuations between the bake and chill steps. Moreover, the movement of the wafer may still contaminate or otherwise damage the wafer, and prevents the realization of short thermal transition times. Finally, Sloan does not teach any way to reduce temperature nonuniformities during the bake or chill steps.

It should be noted that, in addition to photoresist processing, semiconductor wafer manufacturing also includes other very different wafer heating processes. For example, rapid thermal processing (RTP) typically uses intense radiation to heat the wafer to temperatures over 700 OC to anneal and oxidize the wafer. As in photoresist processing, it is important in RTP to maintain wafer temperature uniformity.

Accordingly, various methods have been developed to control temperature uniformity in RTP, such as providing multiple radiant heating zones for differentially heating the wafer. Such methods are described in U.S. Pat. No. 5,418,885 issued to Hauser et al. on May 23, 1995 and U.S. Pat. No. 5,436,172 issued to Moslehi on Jul. 25, 1995. These methods, however, are not applicable to the problem of maintaining temperature uniformity in photoresist processing where the temperatures are several times lower, the heating is conductive rather than radiative, and the required use of both active cooling and heating involves wafer movement and its associated problems.

OBJECTS AND ADVANTAGES OF THE INVENTION

Accordingly, it is a primary object of the present invention to provide an improved method and apparatus for thermal cycling material substrates, e.g. semiconductor wafers in photoresist processing and flat panel displays in display processing. In particular, it is an object of the present invention to provide a method and apparatus for thermal cycling that eliminates the need to move the substrate between distinct bake/chill plates and that provides continuous and multizone control of substrate temperature throughout the entire bake/chill cycle. Further advantages of the invention will be apparent from the following description and drawings.

SUMMARY OF THE INVENTION

The invention presents a thermal cycling module for thermally processing a material substrate. The thermal cycling module conducts heat to and from the substrate during both bake and chill stages of the thermal cycle. Because the substrate is not moved during the entire bake/chill cycle, the invention avoids entirely the prior art problems introduced by moving the substrate between separate bake and chill plates.

The thermal cycling module of the present invention includes at least one thermoelectric device for thermally contacting a substrate region. The module also includes a heat exchanger in thermal contact with the thermoelectric device. The heat exchanger has a passage for permitting fluid flow therethrough. A fluid supply is connected to the passage of the heat exchanger. The fluid supply includes a plurality of fluids having differing temperatures and a fluid valve for controlling relative amounts of flow of the fluids through the heat exchanger. The module further includes a control system connected to the thermoelectric device and the fluid valve for cycling a substrate temperature at the substrate region between a first process temperature and a second process temperature.

In a preferred embodiment of the invention, the control system includes a variable power supply in electrical contact with the thermoelectric device, and a controller in electrical contact with the variable power supply and the fluid valve. The controller has a microprocessor programmed to cycle the substrate temperature at the substrate region between the first process temperature and the second process temperature. Also in the preferred embodiment, the module includes a thermally conductive element, such as a plate, for thermally contacting the substrate region. The thermally conductive element is preferably positioned between the thermoelectric device and the substrate region such that the thermoelectric device thermally contacts the substrate region through the thermally conductive element.

The module also preferably includes at least one temperature sensor in electrical contact with the controller for sensing the substrate temperature at the substrate region and for sending to the controller a sensor signal representative of the measured substrate temperature. The microprocessor is programmed to adjust the variable power supply and the fluid valve in response to the sensor signal in order to control the substrate temperature at the substrate region.

BRIEF DESCRIPTION OF THE FIGURES

FIG. 17 is a plan view of a foil heater having multiple heating zones.

FIG. 18 is a plan view of the heating zones of the foil heater of FIG. 17.

FIG. 19 is a plan view of a foil heater having multiple heating zones according to another embodiment of the invention.

FIG. 20 is a plan view of the heating zones of the foil heater of FIG. 20.

DETAILED DESCRIPTION

The following description of a preferred embodiment of the invention contains specific details for purposes of illustration. It will be obvious to anyone of ordinary skill in the art that the essential ideas and principles of the invention may be implemented in various substantially similar ways and that many of the following details can be altered to result in substantially the same results.

Figure 1:
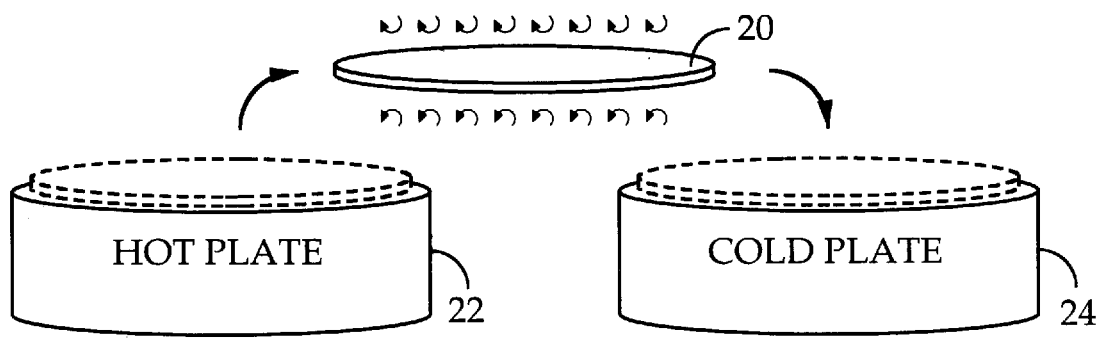
FIG. 1 depicts a prior art photoresist processing method involving the movement of the substrate from a hot plate to a cold plate.
Figure 2:
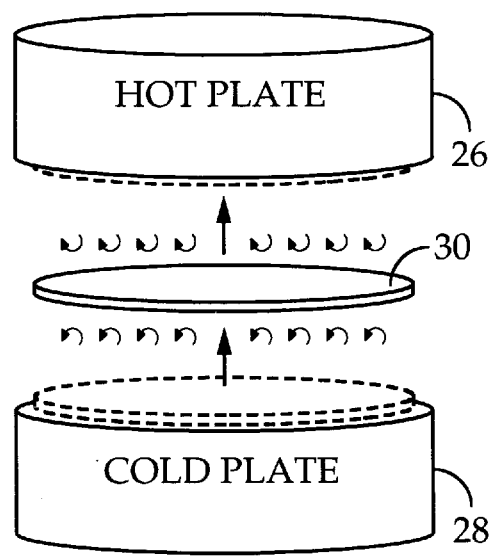
FIG. 2 depicts another prior art photoresist processing method involving a reduced movement of the substrate between a hot plate and a cold plate.
Figure 3:
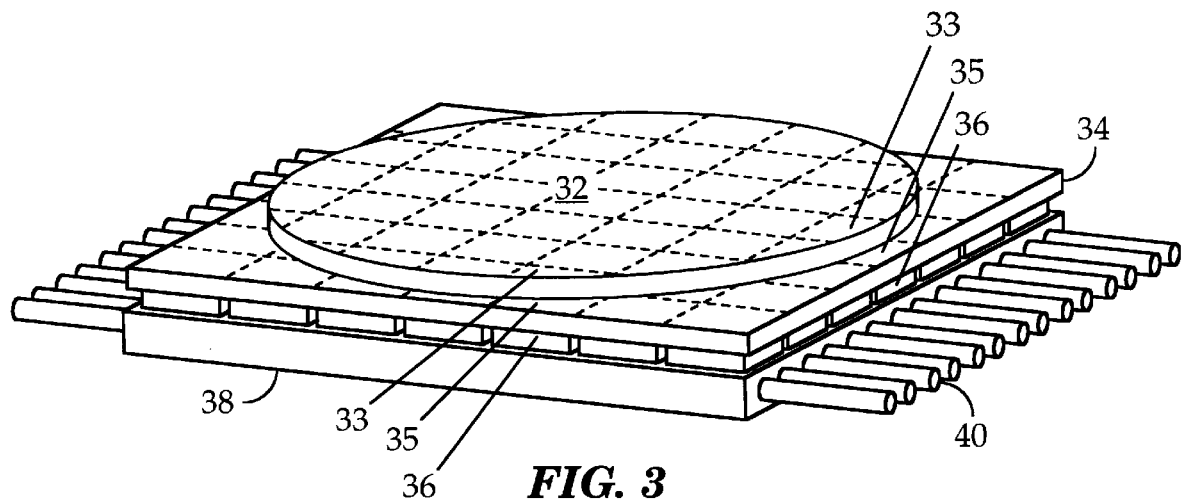
FIG. 3 is a perspective view of a thermal cycling module according to a preferred embodiment of the invention.

FIG. 3 shows a perspective view of a thermal cycling module according to the preferred embodiment. A substrate 32, such as a semiconductor wafer or flat panel display, is baked and chilled through thermal contact with a thermally conductive plate 34, an array of thermoelectric devices (TEDs) 36, and a heat exchanger 38. For the purposes of the present description and the appended claims, thermal contact is defined to include physical proximity sufficient to permit the transfer of heat, direct physical contact, and indirect physical contact sufficient to permit the transfer of heat through an intervening element or elements.

Substrate 32 is preferably placed in thermal contact with plate 34 through physical proximity or through direct physical contact. Both methods of establishing thermal contact are well known in the art and typically include positioning the substrate approximately 0.1 mm from the plate, or holding the substrate directly against the plate with a vacuum line, electrostatic clamp, or gravity. In the preferred embodiment, substrate 32 is placed in thermal contact with plate 34 through physical proximity, although any of the known methods of thermal contact may also be used.

Plate 34 is preferably made of copper or other suitably thermally conductive material and has a thickness in the range of 1 to 5 mm, preferably 1 to 3 mm so that plate 34 has a low thermal mass. Plate 34 has plate regions 35 for thermally contacting corresponding regions 33 of the substrate. Plate 34 is positioned between substrate 32 and TEDs 36 such that TEDs 36 thermally contact corresponding substrate regions 33 through plate regions 35. For illustrative clarity, TEDs 36 are shown with spaces between them. In the preferred embodiment, however, there are no spaces between TEDs 36. Also in the preferred embodiment, TEDs 36 are capable of both heating and cooling Beneath the layer of TEDs 36 is a fluid heat exchanger 38 in thermal contact with TEDs 36, and in turn, with plate 34. Heat exchanger 38 has passages or channels 40 through which fluid may flow for heating or cooling. Heat exchanger 38 is preferably 1 to 2 cm thick and composed of copper or other suitable material having a high thermal conductivity. The temperature of plate 34 is determined primarily by the temperature of the fluid flowing through heat exchanger 38. In contrast to prior art systems, however, the layer of TEDs 36 provide improved control of the temperature of plate 34, and the different fluid temperatures combined with the low thermal mass allow the single plate to be used for both heating and cooling.

In the preferred embodiment, each TED 36 is controlled to change temperature quickly and with high precision. Consequently, the temperature of a corresponding plate region 35 and substrate region 33 can also be controlled with high precision and speed. Moreover, because TEDs 36 are individually controllable, one region of substrate 32 can be heated or cooled in a different manner from another region. Such selective temperature control gives the present device the capability to maintain unprecedented spatial and temporal control of substrate temperature throughout the thermal cycle.

Figure 4A:
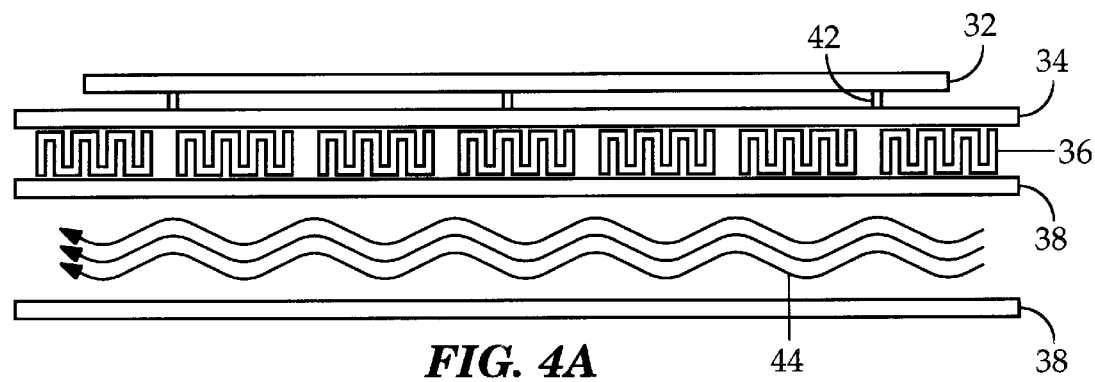
FIG. 4A is a cross-sectional view of the thermal cycling module of FIG. 3.

FIG. 4A is a cross-sectional view of the elements illustrated in FIG. 3. Substrate 32 rests on separators 42 which position the substrate at a distance within 0.1 mm of plate 34. The close proximity of substrate 32 to plate 34 allows heat to be transferred efficiently between the substrate and the plate with minimal contact. TEDs 36 rest below plate 34 and are in direct thermal contact with heat exchanger 38. Fluid 44 flowing through heat exchanger 38 exchanges heat with substrate 32 through TEDs 36 and plate 34. Fluid 44 roughly determines the temperature of the entire substrate, while TEDs 36 precisely determine local variations in the temperature of the substrate at specific substrate regions.

While it is presently preferred that the thermal cycling module include a thermally conductive element in the form of plate 34, it is to be understood that the thermally conductive element may be in the form of a thin film, membrane, or covering layer placed over TEDs 36. Plate 34 is presently preferred to allow mechanical clamping of TEDs 36 and heat exchanger 38 and to prevent contamination of the substrate. However, it is not necessary to include a thermally conductive element in the thermal cycling module. In an alternative embodiment, plate 34 is eliminated and substrate 32 is placed in direct thermal contact with TEDs 36. In this alternative embodiment, separators 42 preferably extend from TEDs 36 to position the substrate within 0.1 mm of the TEDs. A protective film of aluminum or ceramic material may optionally be placed over the TEDs to prevent contamination of the substrate and to prevent wear of the TEDs.

Figure 4B:
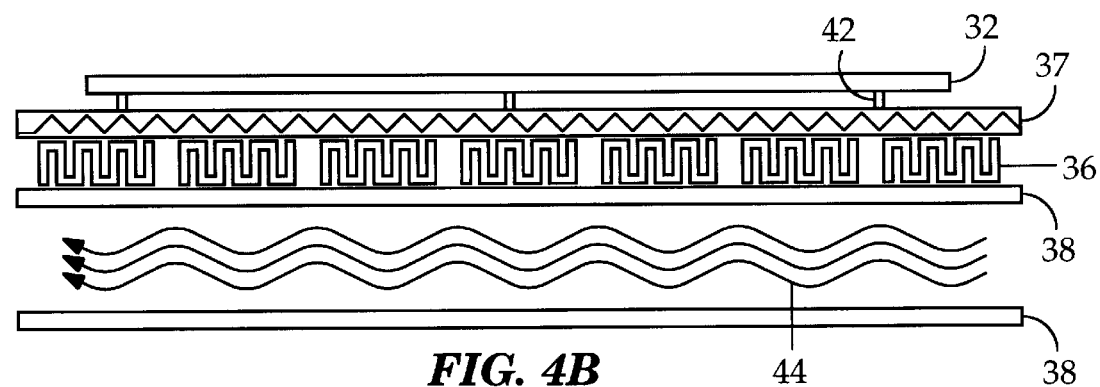
FIG. 4B is a cross-sectional view of a thermal cycling module according to an alternate embodiment of the invention.

FIG. 4B shows a cross sectional view of another embodiment in which plate 34 is removed and TEDs 36 are supplemented by a resistive heating element, such as a foil heater 37, which is positioned on top of TEDs 36. Although resistive heating elements are capable only of heating, for the purposes of this description and the appended claims, they are considered nevertheless to be a type of thermoelectric device. Foil heater 37 may also replace TEDs 36, as will be described in alternate embodiments below. Foil heater 37 provides additional bulk heating during baking. Otherwise, this embodiment is similar to the preferred embodiment. In a variation on the above, a resistive heating element may be positioned on the bottom surface of heat exchanger 38. Other arrangements of the layers shown in FIGS. 4A–4B are also possible.

Figure 5:
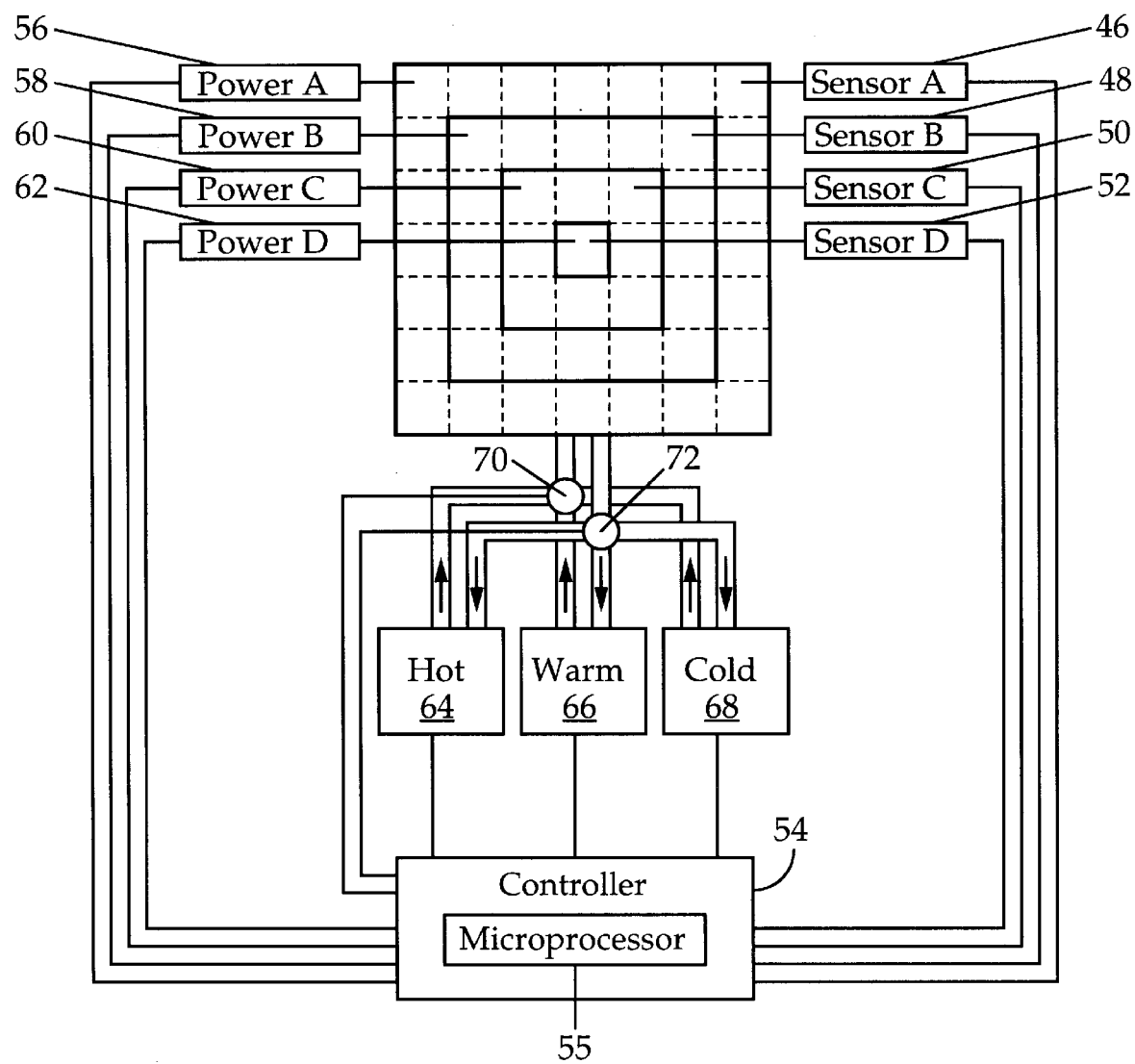
FIG. 5 is a schematic diagram of a feedback control loop of the thermal cycling module of FIG. 3.

FIG. 5 is a schematic diagram of a feedback control loop according to the preferred embodiment. The feedback control loop is used to regulate the substrate temperature during the thermal cycle. Sensors 46, 48, 50, and 52 are in electrical contact with a multivariable feedback controller 54. The sensors send to controller 54 electrical signals representative of substrate temperatures or process parameters of corresponding substrate regions. Each of the sensors may be a temperature sensor, such as a thermocouple or infrared (IR) sensor, or a process sensor such as a scatterometer.

Sensors 46, 48, 50, and 52 are positioned to sense particular temperatures and/or process parameters at specific regions of the substrate. For example, IR sensors may be positioned above the substrate to detect infrared radiation from particular substrate regions. Similarly, thermocouple sensors may be placed in thermal contact with the substrate to sense substrate temperatures at particular substrate regions. The thermocouples are preferably imbedded in the thermally conductive plate. In embodiments of the thermal cycling module which do not include the plate, thermocouples may be imbedded in the layer of TEDs. Specific techniques for measuring substrate temperatures and process parameters are well known in the art.

Based on the sensor signals, a microprocessor 55 in controller 54 calculates control signals and sends them to variable power supplies 56, 58, 60, and 62. The variable power supplies are in electrical contact with TEDs 36 (FIGS. 3 and 4) and with controller 54. The variable power supplies change flows of electric current through the TEDs in accordance with the control signals received from microprocessor 55. Microprocessor 55 calculates and sends additional control signals to fluid supplies 64, 66, and 68, and to an outflow valve 70 and inflow valve 72. Outflow valve 70 and inflow valve 72 control the flow of fluid 44 through channels 40 of heat exchanger 38 (FIGS. 3 and 4). In the alternate embodiment discussed in relation to FIG. 4B, microprocessor 55 also sends control signals to control the power supplied to foil heater 37.

Figure 6:
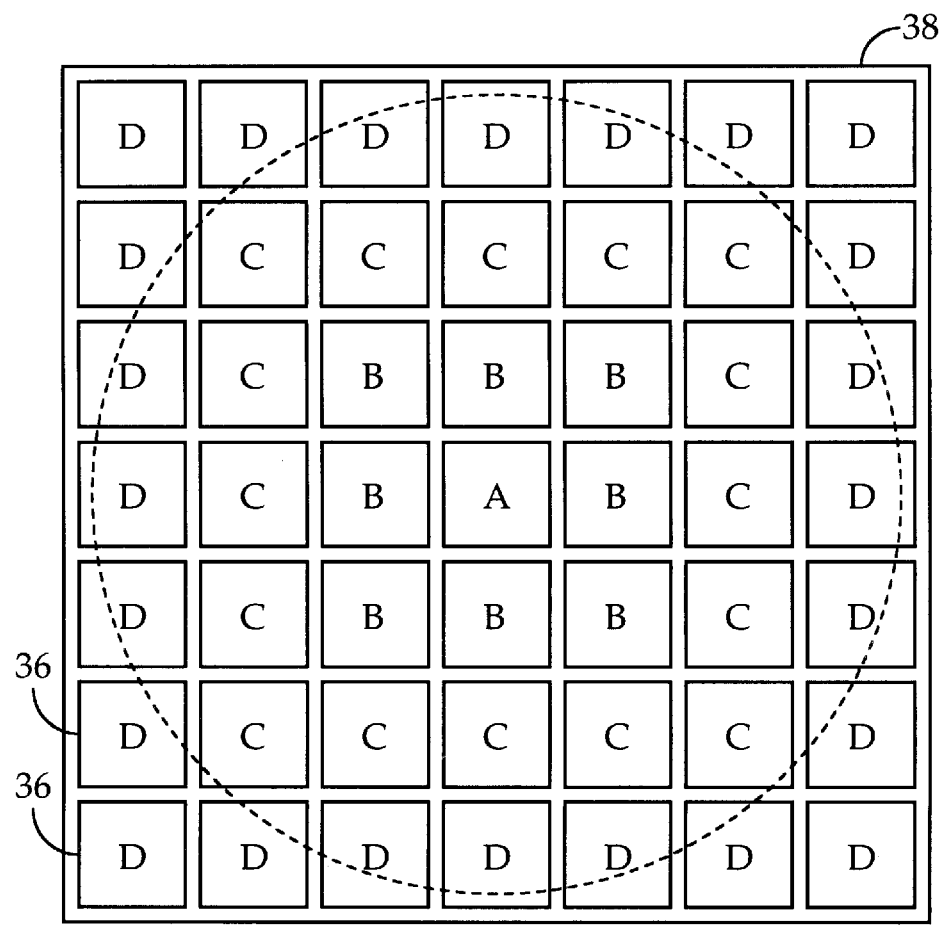
FIG. 6 is a plan view of an arrangement of thermoelectric devices according to the preferred embodiment of the invention.

As shown in FIG. 6, the array of TEDs 36 is divided into four groups labeled A, B, C, and D. Although the TEDs are shown slightly separated for illustrative clarity, they are preferably juxtaposed with each other. The TEDs in each group are electrically connected in series and commonly controlled. In the preferred embodiment, the groups roughly correspond to rings of differing radial distances from the center of the plate.

Each group of TEDs is independently controlled by a separate variable power supply. In particular, groups A, B, C, and D are controlled, respectively, by power supplies 56, 58, 60, and 62 (FIG. 5). Similarly, sensors 46, 48, 50, and 52 (FIG. 5) are placed to sense temperature or process parameters of the substrate corresponding, respectively, to groups A, B, C, and D. Thus, the thermal cycling module individually senses and controls temperature and/or process parameters at different regions of the substrate, providing spatial and temporal control over the temperature and/or process parameters.

Figure 7A:
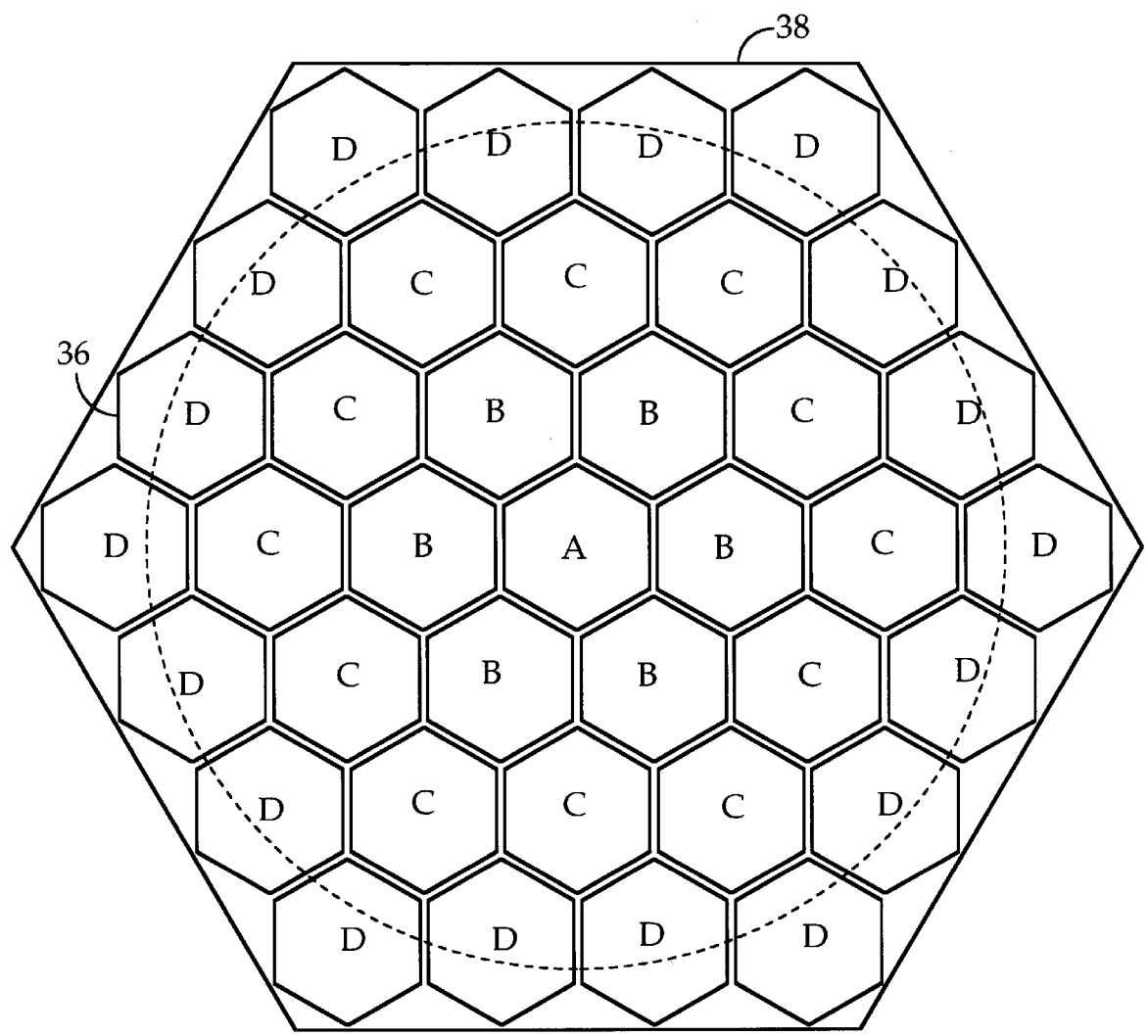
FIG. 7A is a plan view of an arrangement of thermoelectric devices in an alternate embodiment of the invention.
Figure 7B:
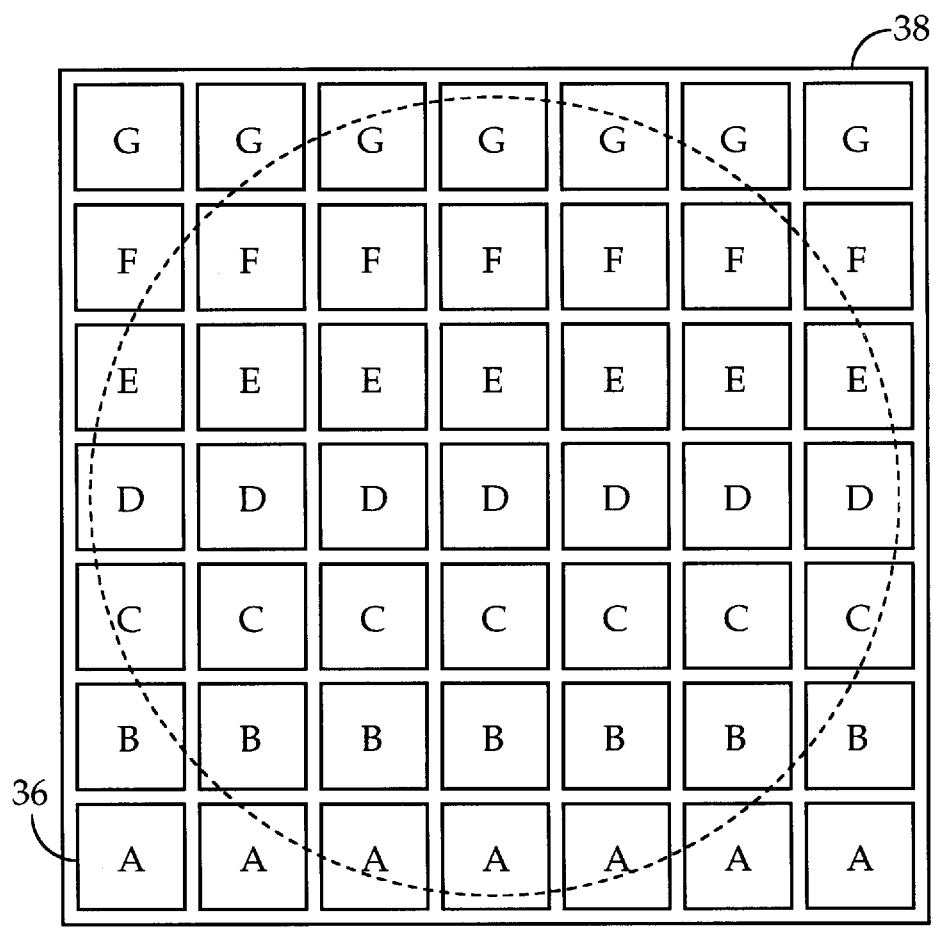
FIG. 7B is a plan view of an arrangement of thermoelectric devices in another embodiment of the invention.

Referring to FIG. 7A, TEDs 36 may be hexagonal rather than square in shape and may be arranged in a hexagonal rather than a square grid. Obviously, other shapes and geometrical arrangements of TEDs 36 are possible, although it is preferable to have shapes that form a continuous tiling beneath the plate so that no gaps exist between TEDs 36. Additionally, TEDs 36 need not be divided into radial groups, but may be divided into other groupings or individually controlled. For example, FIG. 7B shows a grouping of TEDs 36 corresponding to horizontal bands rather than radial rings. The TEDs may also be controlled to provide intentionally nonuniform temperature distributions to create or compensate for nonuniformities measured by sensors 46, 48, 50, and 52 (FIG. 5). Consequently, the thermal cycling module is capable of significantly improving and controlling critical dimension uniformity.

Figure 8:
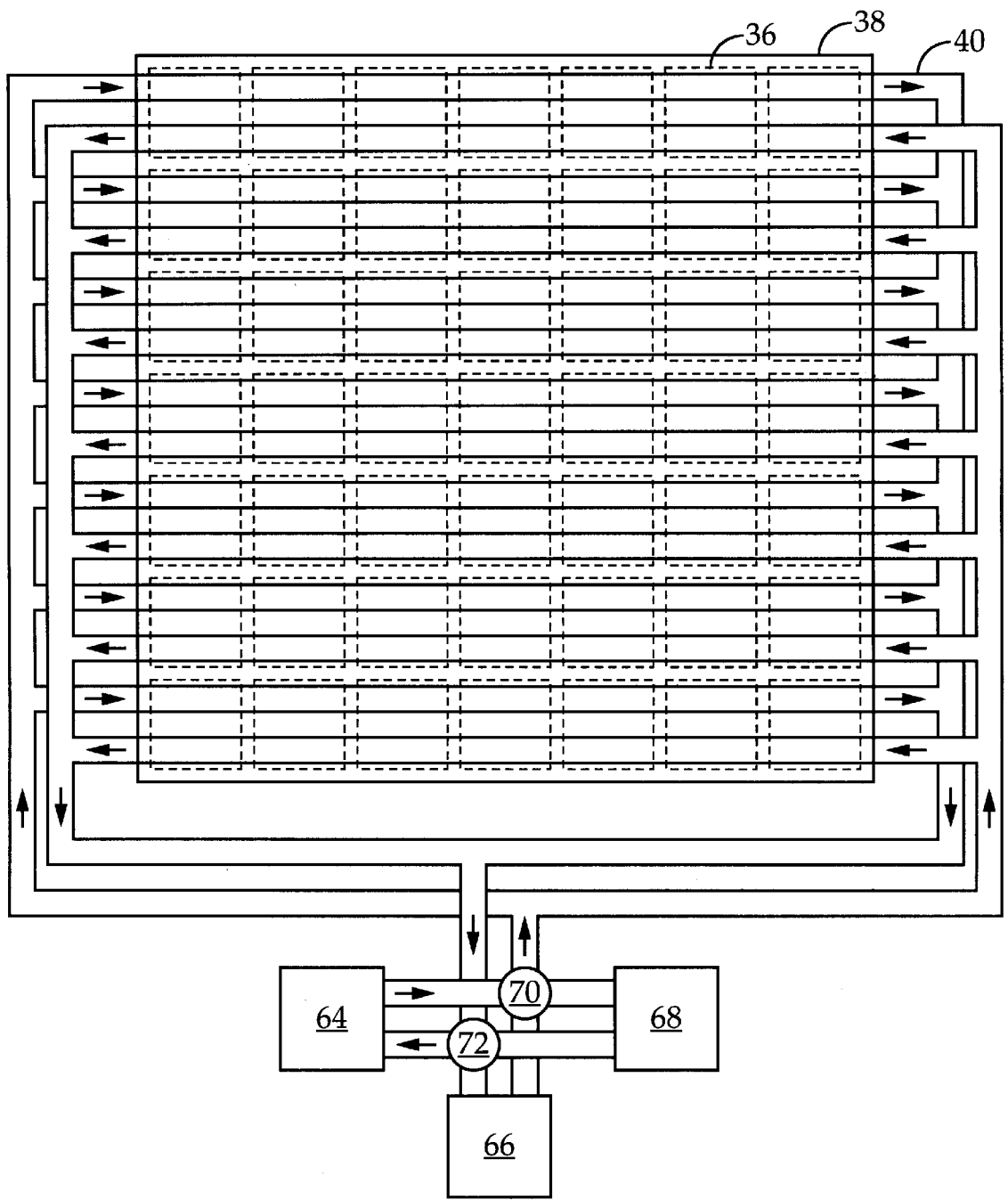
FIG. 8 is a plan view of an arrangement of fluid channels in the preferred embodiment of the invention.

As shown in FIG. 8, channels 40 are preferably arranged such that the flow of fluid through heat exchanger 38 is countercurrent. This counter-current flow enhances the temperature uniformity throughout heat exchanger 38. The state of valves 70 and 72 determines the relative amounts of fluids from fluid supplies 64, 66, and 68 which are sent through heat exchanger 38. FIG. 8 illustrates a state in which only fluid from hot fluid supply 64 flows. Valves 70 and 72 may be adjusted to permit only one temperature of fluid to flow, or a mixture of two fluids.

Figure 9:
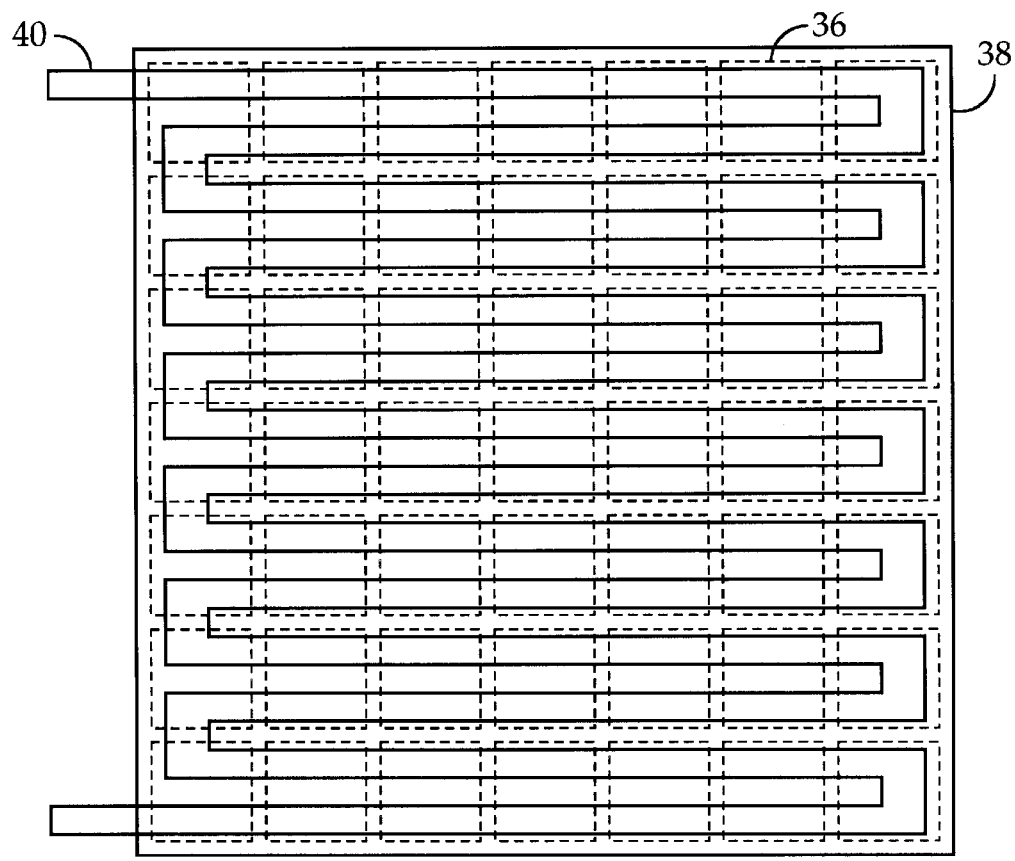
FIG. 9 is a plan view of an arrangement of fluid channels in an alternate embodiment of the invention.

For the purposes of the present description and the appended claims, fluids are defined to include both liquids and gases. In the preferred embodiment, the liquids used in the heat exchanger are solutions of ethylene glycol and water. The gases are preferably pressurized steam or dry air. However, other suitable fluids may be chosen in alternative embodiments. Moreover, the cycling module may be simplified by using a single passage or channel 40 through heat exchanger 38, as shown in FIG. 9. Although this arrangement can result in temperature gradients across the heat exchanger, these gradients can be compensated for by appropriate control of TEDs 36. In particular, the grouping of TEDs shown in FIG. 7B may be used to compensate for the temperature gradients.

The present device is typically used through the specification of predetermined process parameters characteristic of the desired thermal cycle. For example, controller 54 (FIG. 5) may be programmed to start a substrate at 30° C. and quickly ramp it up to 80° C. for 60 s after which it is chilled to 10° C. for 30 s and then returned to 30° C. to complete the cycle. In this example, controller 54 sets fluid supplies 64, 66, and 68 to temperatures of 80° C. 30° C. and 10° C., respectively. Initially, controller 54 sets valves 70 and 72 to permit only the 30° C. fluid from fluid supply 66 to flow through heat exchanger 38. If any one of sensors 46, 48, 50 and 52 indicates a temperature other than 30° C., then controller 54 calculates and sends a control signal to the corresponding one of power supplies 56, 58, 60 and 62 to appropriately heat or cool the corresponding substrate region. In this manner, the temperature of each substrate region is dynamically maintained at a uniform desired temperature.

At a specified point in time, controller 54 begins a transition phase to ramp the temperature from 30° C. to 80° C. At this point, controller 54 sets valves 70 and 72 to permit only 80° C. fluid from fluid supply 64 to flow through heat exchanger 38. In order to provide a more rapid temperature response, controller 54 also calculates and sends control signals to power supplies 56, 58, 60, and 62 that send electric currents through TEDs 36 to rapidly heat the plate. Once sensors 46, 48, 50 and 52 indicate temperatures near 80° C., the transition phase is completed and controller 54 begins a baking phase where a uniform temperature of 80° C. is maintained through feedback in the same manner as the temperature was maintained at 30° C.

After baking the substrate for 60 s, controller 54 begins a second transition phase to ramp the substrate temperature from 80° C. to 10° C. At this point, controller 54 sets valves 70 and 72 to permit only 10° C. fluid from fluid supply 68 to flow through heat exchanger 38. Controller 54 also sends control signals to power supplies 56, 58, 60 and 62 that send electric currents through TEDs 36 to rapidly cool the plate. Once sensors 46, 48, 50, and 52 indicate temperatures of 10° C., the second transition phase is completed and controller 54 begins a chill phase where a uniform temperature of 10° C. is maintained through feedback. After the chill phase is completed, controller 54 begins a third transition phase to ramp the temperature from 10° C. to 30° C. in a manner analogous to the transition phases described above. When the third transition is completed, the thermal cycle is complete.

Anyone skilled in the art will be able to program the controller to execute this and many other thermal cycles involving any number of phases and transitions of different types. In the preferred embodiment, the control signal for each of the various power supplies is calculated in dependence upon the sensed signals from all four sensors. In alternative embodiments, however, the control signals may be decoupled. It should also be noted that some processes may call for intentionally nonuniform temperature distributions. Other processes may include the use of heater 37 in addition to TEDs 36. Controller 54 can be programmed by anyone of ordinary skill in the art to implement these and other variations.

FIGS. 10–13 illustrate a second embodiment of the invention in which TEDs 36 are replaced by a single resistive heating element, such as foil heater 37. Foil heater 37 is used in conjunction with heat exchanger 38 to control the temperature of substrate 32, much like the TEDs of the preferred embodiment. The use of foil heater 37 in place of the array of TEDs simplifies the construction of the thermal cycling module while still providing for precise control of thermal cycles. Although it is presently preferred to use a foil heater as the resistive heating element, other suitable resistive heaters may also be selected.

Figure 10A:
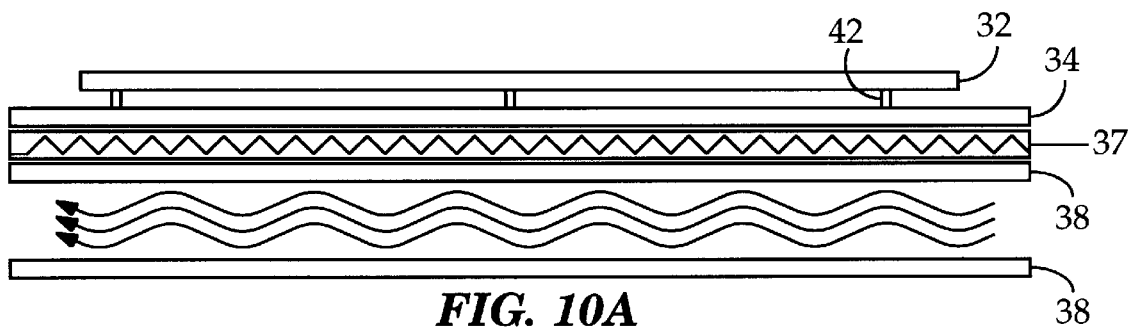
FIG. 10A is a cross-sectional view of a thermal cycling module according to an alternate embodiment of the invention.

As shown in FIG. 10A, foil heater 37 is preferably positioned below plate 34 such that foil heater 37 is in thermal contact with substrate 32 through plate 34. Heat exchanger 38 is positioned below foil heater 37 such that heat exchanger 38 is in thermal contact with foil heater 37. The temperature of substrate 32 is determined primarily by the temperature of the fluid flowing through heat exchanger 38. Foil heater 37 provides incremental heat for precise control of the substrate temperature.

Figure 10B:
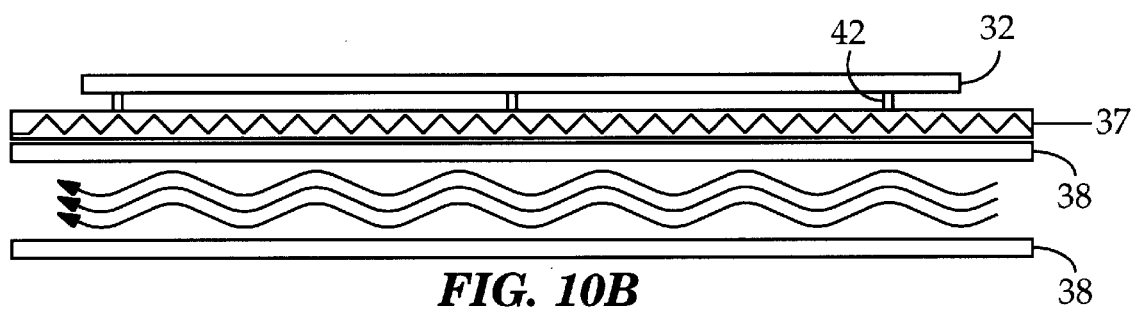
FIG. 10B is a cross-sectional view of a thermal cycling module according to another embodiment of the invention.

As in the preferred embodiment, it is presently preferred to include plate 34 in the thermal cycling module to prevent contamination of the substrate. However, plate 34 is not a necessary element of the thermal cycling module. FIG. 10B shows an alternative embodiment in which plate 34 is eliminated and substrate 32 is placed in direct thermal contact with foil heater 37. In this embodiment, a protective film of aluminum or ceramic material may be placed over foil heater 37 to prevent contamination of the substrate.

Figure 10C:
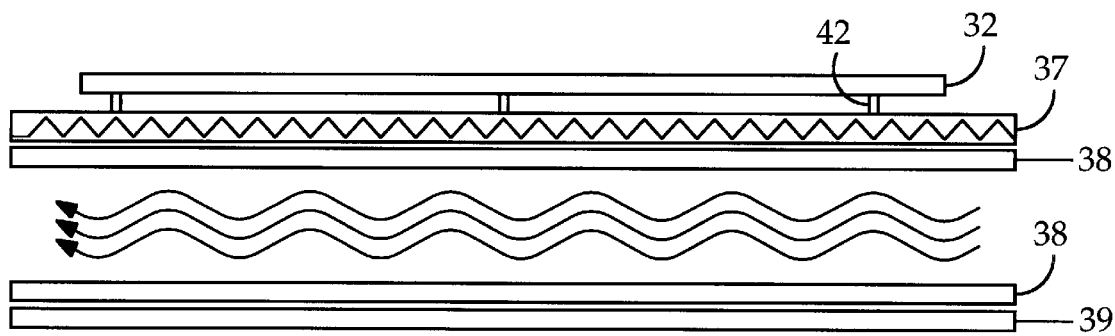
FIG. 10C is a cross-sectional view of a thermal cycling module according to another embodiment of the invention.

FIG. 10C illustrates another embodiment in which foil heater 37 and heat exchanger 38 are supplemented by an additional heating element 39. Heating element 39 may be another resistive heating element or any other type of thermal heating device. Heating element 39 is preferably positioned below heat exchanger 38 and provides additional bulk heating during baking. Otherwise, this embodiment is similar to the embodiment shown in FIG. 10C.

Figure 11:
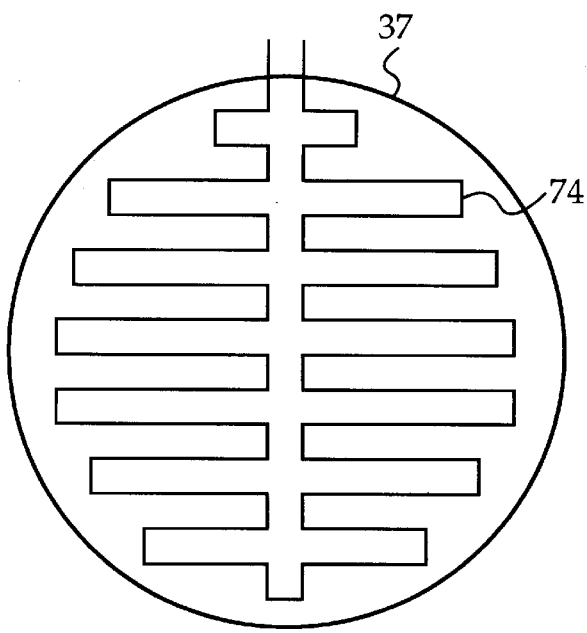
FIG. 11 is a plan view of a foil heater of the thermal cycling module of FIG. 10A.
Figure 12:
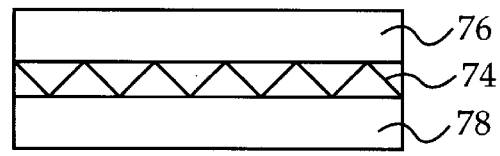
FIG. 12 is a cross-sectional view of the foil heater of FIG. 11.

FIGS. 11–12 illustrate the structure of foil heater 37 in greater detail. Foil heater 37 includes an upper layer 76 and a lower layer 78. Both layers are preferably formed from an insulating material, such as Kapton®. A coil, wire, or line 74 is disposed between upper layer 76 and lower layer 78. Line 74 is made of an electrically conductive material, such as tungsten or nickel-chromium, for conducting electric current through foil heater 37. The ends of line 74 are connected to a power supply through a power modulator (not shown in FIGS. 11–12).

Foil heater 37 preferably has a watt density of at least 1.55 $W/cm^2$. If desired, line 74 may be patterned to vary the watt density in specific regions of foil heater 37 to provide intentional temperature nonuniformities. For example, wafers undergoing processing often experience greater heat loss at their edges. To compensate for this heat loss, line 74 may be patterned to provide a watt density that increases radially from the center of foil heater 37. Specific techniques for varying the watt density of a foil heater in this manner are well known in the art.

Figure 10D:
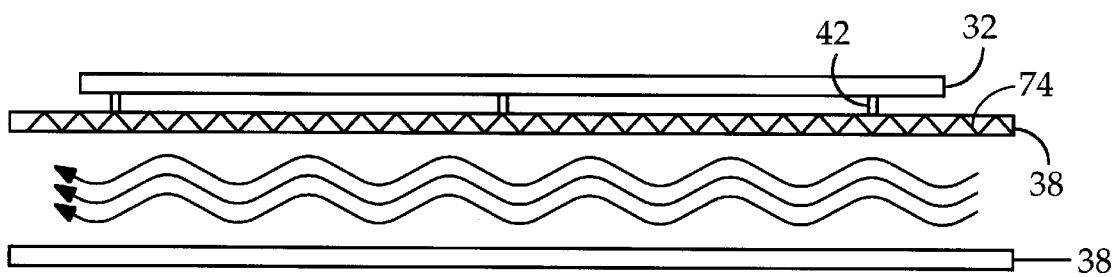
FIG. 10D is a cross-sectional view of a thermal cycling module according to another embodiment of the invention.

Although it is presently preferred to use a complete foil heater in the thermal cycling module, the module may be simplified by using only line 74 as the resistive heating element, as shown in FIG. 10D. Line 74 is preferably imbedded in the top section of heat exchanger 38. In this embodiment, the top section of heat exchanger 38 is formed from an insulating material, such as ceramic, quartz, or Teflon®. Of course, it is also possible to imbed line 74 in the bottom section of heat exchanger 38.

Figure 13:
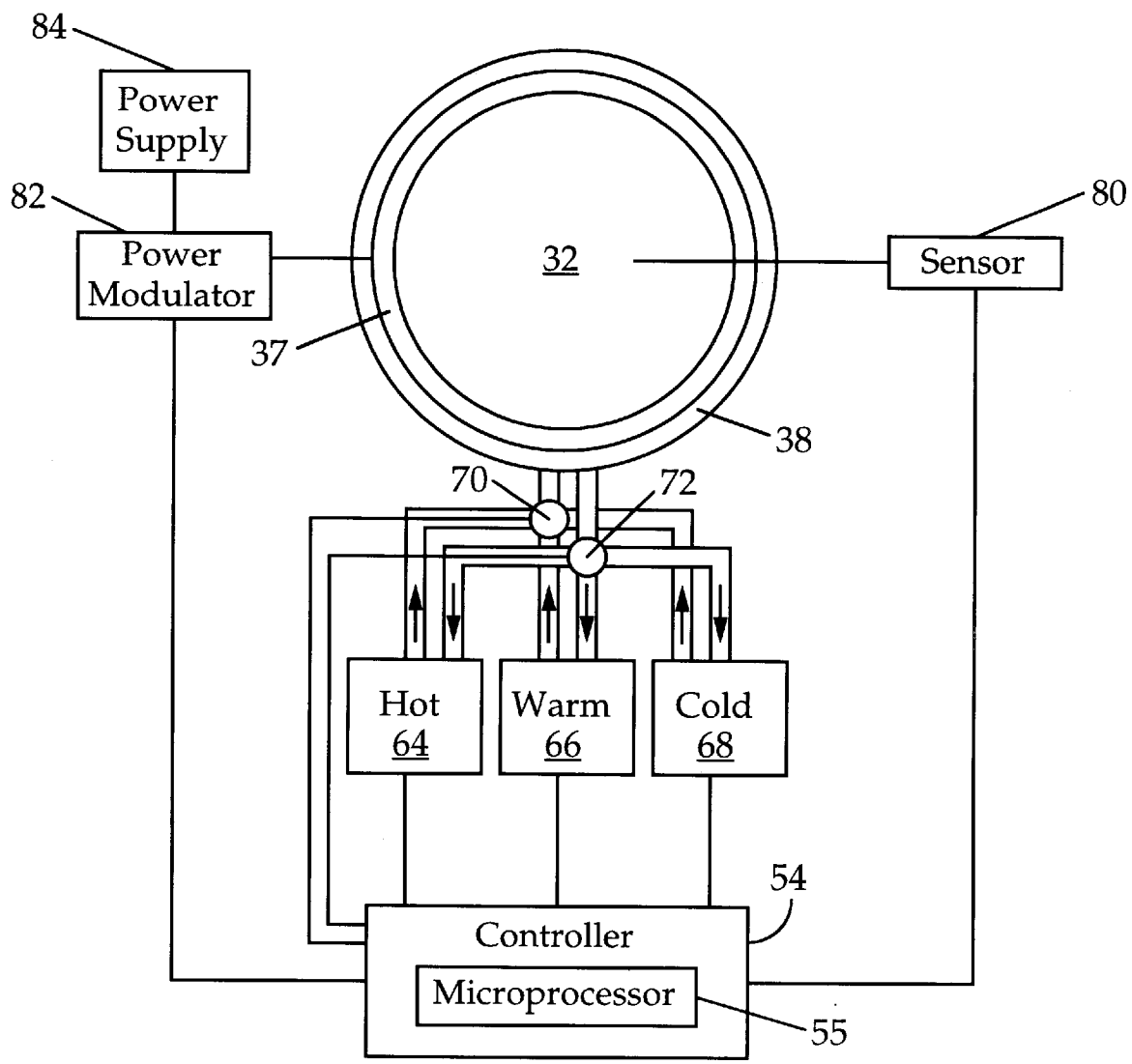
FIG. 13 is a schematic diagram of a feedback control loop according to another embodiment of the invention.

FIG. 13 is a schematic diagram of a feedback control loop according to the second embodiment. The feedback control loop is used to regulate the substrate temperature during the thermal cycle. The control loop includes a power modulator 82, such as a solid-state relay circuit or a linear power amplifier, which is connected to foil heater 37 and to a power supply 84. Power supply 84 and modulator 82 provide a variable supply of power to foil heater 37. Power modulator 82 is in electrical contact with controller 54 and modulates the flow of electric current through foil heater 37 under the control of microprocessor 55. Power supply 84 preferably provides 120 V AC, although any suitable voltage and/or direct current may also be used to power foil heater 37.

As in the preferred embodiment, the feedback control loop also includes at least one sensor 80 in electrical contact with controller 54. Sensor 80 sends to controller 54 electrical signals representative of a substrate temperature or process parameter at a substrate region. For example, sensor 80 may be a thermocouple sensor imbedded in the plate, an IR sensor positioned above substrate 32, or a process sensor such as a scatterometer. In embodiments in which the thermal cycling module does not include a thermally conductive plate, a thermocouple may be imbedded in the top layer of foil heater 37.

Based on the sensor signals, microprocessor 55 calculates control signals and sends them to power modulator 82. In response to the signals, power modulator 82 modulates the flow of electric current through foil heater 37. As in the preferred embodiment, additional control signals are calculated and sent to fluid supplies 64, 66, and 68, and to outflow valve 70 and inflow valve 72. In the alternate embodiment discussed in relation to FIG. 10C, microprocessor 55 also sends control signals to control the power supplied to additional heating element 39.

Figure 14:
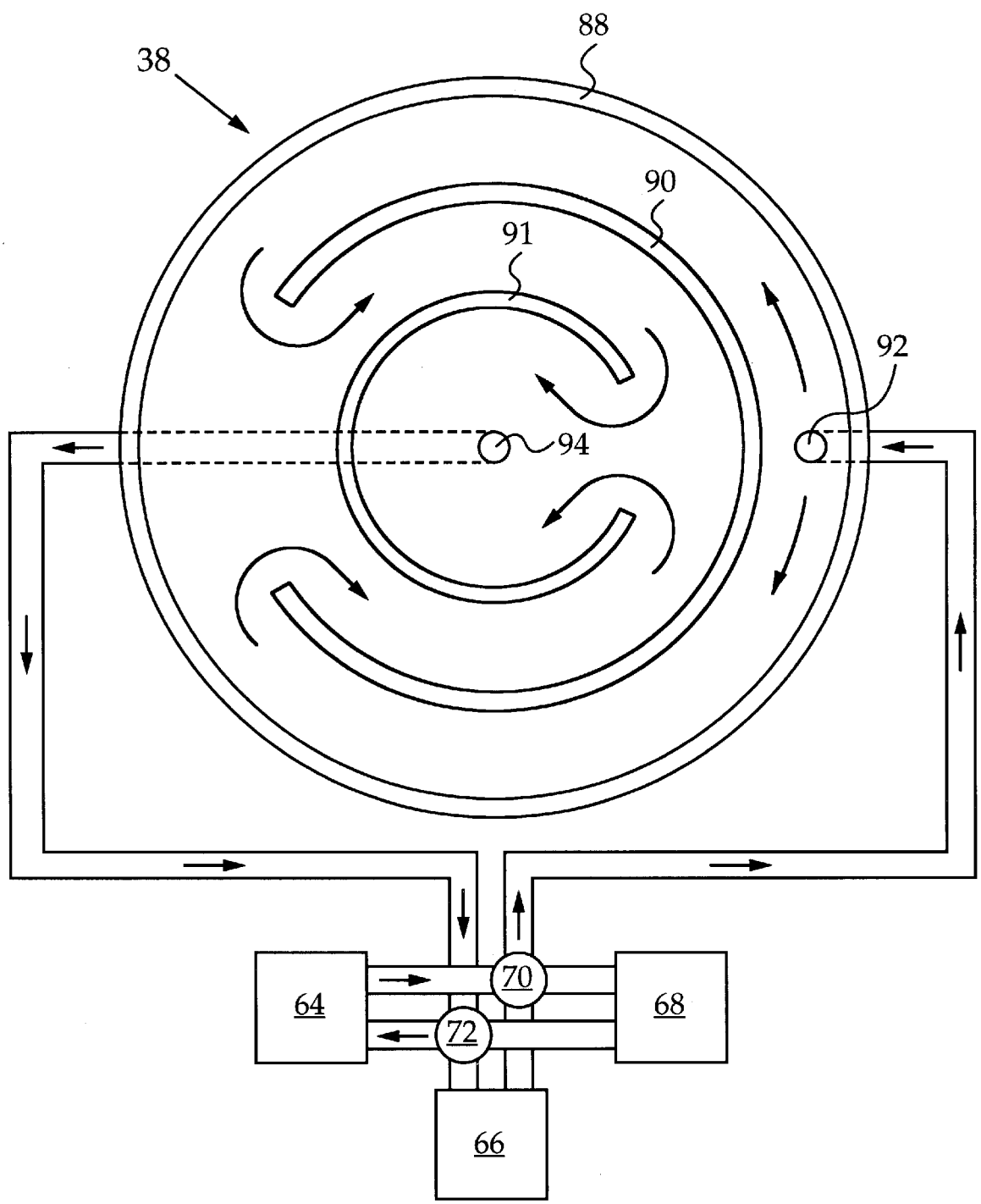
FIG. 14 is a plan view of an arrangement of fluid channels in an alternate embodiment of the invention.

Referring to FIG. 14, the thermal cycling module may be further simplified through an alternative design of heat exchanger 38. The alternative design includes circular outer walls 88 and arc-shaped inner walls 90 and 91. Walls 88, 90, and 91 define spiraling channels through the heat exchanger. Fluids from fluid supplies 64, 66, and 68 enter the heat exchanger through an entrance hole 92. Hole 92 is preferably located in the bottom of the heat exchanger. The fluids then flow through the channels to the center of the heat exchanger and exit through an exit hole 94. Exit hole 94 is also preferably located in the bottom of the heat exchanger.

Figure 15:
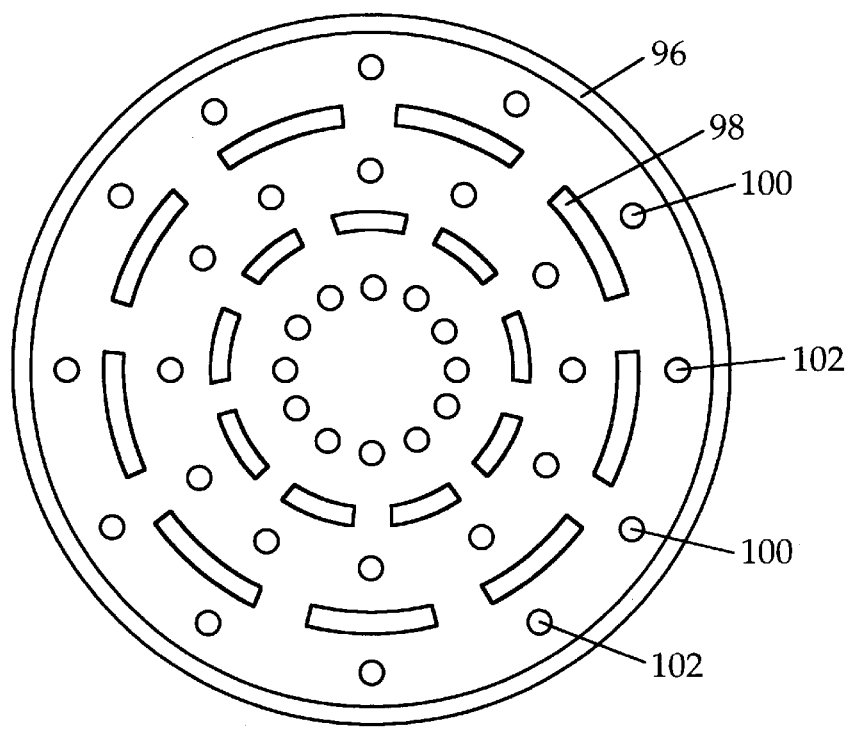
FIG. 15 is a plan view of an arrangement of fluid channels in another embodiment of the invention.

FIG. 15 shows another possible design for the heat exchanger. The design includes circular outer walls 96 and two sets of nine arc-shaped inner walls 98. The sets of inner walls 98 are arranged in two concentric circular patterns, with channels between the walls for fluid flow. The two concentric circular patterns define three zones in the heat exchanger. Each zone preferably includes six entrance holes 100 and six exit holes 102. Fluids from the fluid supplies enter the heat exchanger through entrance holes 100 and exit the heat exchanger through exit holes 102.

The entrance and exit holes are preferably alternated throughout each zone, such that each entrance hole is adjacent two exit holes and such that each exit hole is adjacent two entrance holes. Additionally, the entrance and exit holes are preferably located in the bottom of the heat exchanger. Of course, many variations of the heat exchanger design shown in FIG. 15 are also possible. For example, it is possible to vary the number and placement of inner walls 98 as well as the number and placement of the entrance and exit holes. One advantage of the heat exchangers shown in FIGS. 14–15 is that they are significantly simpler to manufacture than the counter-current heat exchanger of the preferred embodiment, thus reducing manufacturing costs. Another advantage is that both heat exchangers are particularly well suited for gas flow.

Figure 16:
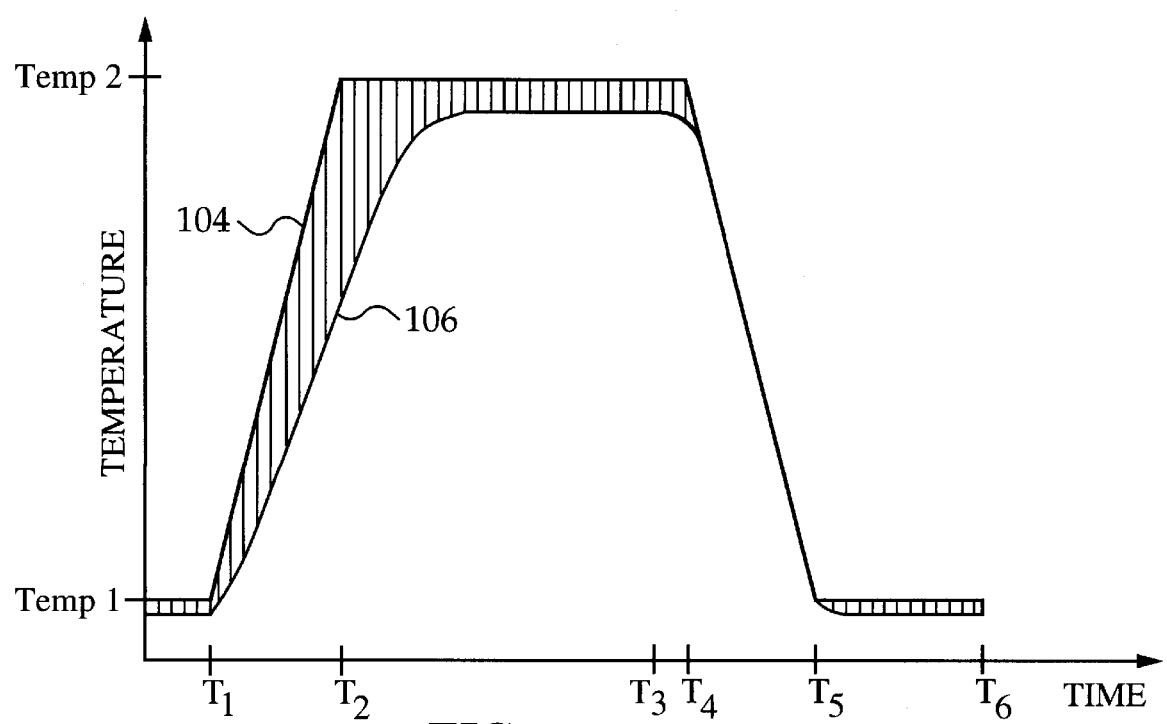
FIG. 16 is a graph showing the relationship between temperature and time in a thermal cycle executed by the module of FIG. 10A.

In the operation of the second embodiment, the temperature of substrate 32 is controlled primarily by the flow of fluids through heat exchanger 38. Foil heater 37 provides incremental heat for achieving the desired process parameters. This relationship is illustrated in the graph of FIG. 16. Curve 104 represents the desired process parameters of a thermal cycle, i.e. the desired temperature of the substrate at each time point in the thermal cycle. Curve 106 represents the temperatures which are achievable at each time point using only heat exchanger 38. Curve 106 approximates but does not directly match curve 104. The differential is indicated by the hatched region of the graph. Foil heater 37 provides the necessary incremental heat to achieve the desired substrate temperatures at each point in the thermal cycle, i.e. the amount indicated by the hatched region.

Controller 54 is programmed to control heat exchanger 38 and foil heater 37 appropriately to execute a thermal cycle. For example, controller 54 may be programmed to start a substrate at 20° C. and quickly ramp it up to 150° C. for 60 s, after which it is chilled to 20° C. for 30 s to complete the cycle. In this example, controller 54 sets hot fluid supply 64 to a temperature of 145° C. and cold fluid supply 68 to a temperature of 15° C. Each fluid supply is preferably set 2° to 10° C. colder than a corresponding desired process temperature. This is to ensure that heat supplied by foil heater 37 may be used to compensate for any temperature fluctuations. Stated another way, because foil heater 37 is only capable of heating, it may only compensate for variations from a desired process temperature by increasing or decreasing the amount of heat it transfers to substrate 32. Accordingly, the fluid supplies are set lower than the desired process temperatures to ensure that foil heater 37 may be used for precise temperature control.

Initially, controller 54 sets valves 70 and 72 to permit only the 15° C. fluid from fluid supply 68 to flow through heat exchanger 38. Controller 54 also calculates and sends a control signal to power modulator 82. In response to the control signal, power modulator 82 allows sufficient current to flow through foil heater 37 to maintain the temperature at 20° C. If sensor 80 indicates a temperature other than 20° C., then controller 54 calculates and sends a new control signal to power modulator 82 in order to change the flow of electric current through foil heater 37. In this manner, the temperature of the plate, and of the substrate, is dynamically maintained at a uniform desired temperature.

At a specified point in time, controller 54 begins a transition phase to ramp the temperature from 20° C. to 150° C. This point in time is indicated as time $T_1$ in FIG. 16. At time $T_1$, controller 54 sets valves 70 and 72 to permit only 145° C. fluid from fluid supply 64 to flow through heat exchanger 38. In order to provide a more rapid temperature response, controller 54 also calculates and sends control signals to power modulator 82 that send larger currents through foil heater 37 to rapidly heat the substrate. At time $T_2$, sensor 80 indicates a temperature of 150° C., and controller 54 begins a baking phase where a uniform temperature of 150° C. is maintained through feedback in the same manner as the temperature was maintained at 20° C.

After baking the substrate for 60 s, the substrate temperature is ramped from 150° C. to 20° C. at time $T_4$. However, in order to provide a faster cooling stage, controller 54 begins the second transition phase prior to time $T_4$. At time $T_3$, controller 54 sets valves 70 and 72 to permit only 15° C. fluid from fluid supply 68 to flow through heat exchanger 38. Controller 54 also sends control signals to power modulator 82 to temporarily increase the flow of electric current through foil heater 37 to compensate for the cool liquid entering heat exchanger 38. At time $T_4$, controller 54 sends a control signal to power modulator 82 to stop the flow of electric current through foil heater 37 so that the substrate may begin to cool.

Once sensor 80 indicates a temperature of 20° C. at time $T_5$, controller 54 sends a control signal to power modulator 82 to restart the flow of electric current through foil heater 37. Controller 54 then begins a chill phase where a uniform temperature of 20° C. is maintained through feedback until time $T_6$. Once the chill phase is completed, the thermal cycle is complete. Anyone skilled in the art will be able to program the controller to execute this and many other thermal cycles involving any number of phases and transitions of different types.

FIGS. 17–20 illustrate a third embodiment of the invention in which the foil heater has multiple, independently controllable heating zones. The multiple heating zones are created by placing multiple electrically conductive lines in the foil heater. For example, FIGS. 17–18 show a foil heater 108 having two zones A and B provided by first and second lines 74A and 74B. FIGS. 19–20 show a foil heater 110 having three zones A, B, and C provided by first, second, and third lines 74A, 74B, and 74C. The heating zones thermally contact corresponding substrate regions through corresponding plate regions in the same manner as the TEDs of the preferred embodiment.

The number of heating zones to be included in the foil heater is dependent upon the desired complexity of the thermal cycling module as well as the size of the wafer to be processed. For example, foil heater 108 is presently preferred for 200 mm wafers, and foil heater 110 is preferred for 300 mm wafers. Of course, it will be apparent to one skilled in the art that the foil heaters may have more heating zones if desired. Obviously, other shapes and geometrical arrangements of the heating zones are also possible.

Figure 21:
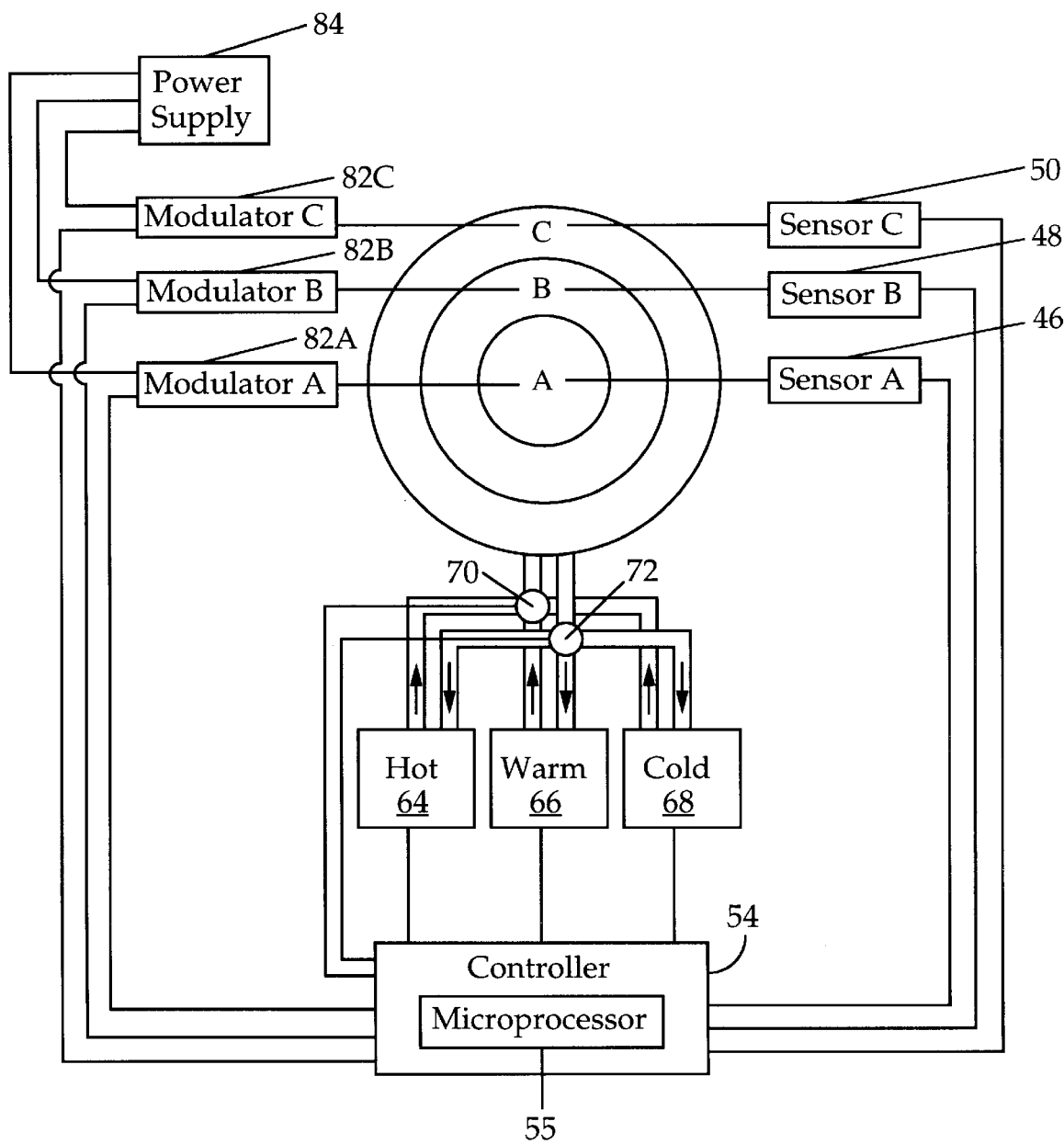
FIG. 21 is a schematic diagram of a feedback control loop according to another embodiment of the invention.

FIG. 21 shows a feedback control loop suitable for controlling foil heater 110. As in the preferred embodiment, the feedback control loop includes sensors 46, 48, and 50 for sending to controller 54 electrical signals representative of a substrate temperature or process parameter of a corresponding substrate region. Based on the sensor signals, microprocessor 55 calculates control signals and sends them to power modulators 82A, 82B, and 82C. Each power modulator is connected to power supply 84 and to a respective one of the lines of foil heater 110. In particular, power modulators 82A, 82B, and 82C are connected, respectively, to lines 74A, 74B, and 74C (FIG. 19) to modulate flows of electric current through heating zones A, B, and C, respectively. As in the previous embodiments, microprocessor 55 also calculates additional temperature control signals and sends the signals to fluid supplies 64, 66, and 68, and to outflow valve 70 and inflow valve 72.

The operation of the third embodiment is analogous to the operation of the second embodiment described above. Of course, in the third embodiment, controller 54 calculates control signals to control the flow of electric current through three heating zones rather than one. Additionally, the control signals for zones A, B, and C are calculated independently based upon desired process parameters and sensor signals received from sensors 46, 48, and 50, respectively. This allows one region of plate 34 and substrate 32 to be heated or cooled in a different manner than another region. Other than the differences described, the operation and advantages of the third embodiment are the same as the operation and advantages of the second embodiment described above.

SUMMARY, RAMIFICATIONS, AND SCOPE

It will be clear to one skilled in the art that the above embodiments may be altered in many ways without departing from the scope of the invention. For example, obvious alterations to the above embodiments include electrostatically clamping the substrate, holding the substrate with a vacuum line or by gravity, inserting temperature measuring devices about an electrostatic clamp, placing the device in an enclosure to minimize convective loss, and passing fluids other than water, pressurized steam, or dry air through the heat exchanger. Other obvious alterations include running cold fluids underneath the heat exchanger during chill stages, and providing a flow of gas, such as helium, beneath the substrate to improve conductivity. It will also be apparent to one skilled in the art that the heat exchanger may have many alternative configurations.

Moreover, many of the aspects of the preferred embodiment are not necessary elements to practice the invention. For example, the thermally conductive plate may be eliminated from the thermal cycling module. It is presently preferred to include the plate to prevent the TEDs and the heat exchanger from contaminating the substrate and to allow clamping of the TEDs, but the plate is not a necessary element. The sensors may also be eliminated and the system may be operated in an "open loop" mode. Further, all of the TEDs may be in a single group controlled by a single power supply. It is also possible to use only one fluid supply and to use a fluid heater/cooler and the TEDs to produce the required temperature transitions in the plate. The thermal cycling module may also be used for multizone heating (or cooling) alone, without switching fluids in the heat exchanger.

It should also be noted that the thermal cycling module of the present invention may be used for purposes other than wafer photoresist processing. For example, the module may be used in the manufacturing of flat panel displays, in polymerase chain reaction (PCR) processes, in thermal fatigue testing, in thermal deformation measurement, in reliability testing, and in any other application which requires precisely controlled thermal cycling. In view of these and many other variations which will be apparent to anyone of ordinary skill in the art, the scope of the invention should be determined by the following claims and their legal equivalents.

What is claimed is:

1. A thermal cycling module for thermally processing a material substrate, the module comprising:
   a) a thermoelectric device for thermally contacting a substrate region;
   b) a heat exchanger in thermal contact with the thermoelectric device, the heat exchanger having a passage for permitting fluid flow therethrough;

c) a fluid supply connected to the passage, wherein the fluid supply comprises a plurality of fluids having differing temperatures and a fluid valve for controlling relative amounts of flow of the fluids through the heat exchanger; and d) control means connected to the thermoelectric device and the fluid valve for cycling a substrate temperature at the substrate region between a first process temperature and a second process temperature.

2. The module of claim 1, further comprising a thermally conductive element for thermally contacting the substrate region, wherein the thermally conductive element is positioned between the thermoelectric device and the substrate region such that the thermoelectric device thermally contacts the substrate region through the thermally conductive element.

3. The module of claim 2, wherein the thermally conductive element comprises a plate.

4. The module of claim 1, wherein the control means comprises:

a) a variable power supply in electrical contact with the thermoelectric device; and b) a controller in electrical contact with the variable power supply and with the fluid valve, the controller having a processor programmed to cycle the substrate temperature at the substrate region between the first process temperature and the second process temperature.

5. The module of claim 4, further comprising a temperature sensor in electrical contact with the controller for sensing the substrate temperature at the substrate region and for sending to the controller a sensor signal representative of the substrate temperature, wherein the processor is programmed to adjust the variable power supply in response to the sensor signal in order to control the substrate temperature at the substrate region.

6. The module of claim 5, wherein the processor is further programmed to adjust the fluid valve in response to the sensor signal in order to further control the substrate temperature at the substrate region.

7. The module of claim 5, wherein the temperature sensor comprises a thermocouple.

8. The module of claim 5, wherein the temperature sensor comprises an infrared sensor.

9. The module of claim 4, further comprising a scatterometer in electrical contact with the controller for sensing a substrate process parameter at the substrate region and for sending to the controller a sensor signal representative of the substrate process parameter, wherein the processor is programmed to adjust the variable power supply in response to the sensor signal in order to control the substrate process parameter at the substrate region.

10. The module of claim 1, wherein the thermoelectric device comprises a resistive heating element.

11. The module of claim 10, wherein the resistive heating element comprises a foil heater.

12. The module of claim 1, further comprising an additional heating element in thermal contact with the heat exchanger for providing bulk heating of the substrate.

13. The module of claim 1, wherein at least one of the fluids is a gas.

14. The module of claim 1, wherein at least one of the fluids is a liquid.

15. The module of claim 1, further comprising a plurality of thermoelectric devices in thermal contact with the heat exchanger for thermally contacting a plurality of corresponding substrate regions, wherein the thermoelectric devices are connected to the control means, and wherein the control means includes means for controlling a plurality of substrate temperatures at the substrate regions in accordance with a plurality of process temperatures.

16. The module of claim 15, further comprising a thermally conductive element for thermally contacting the substrate regions, wherein the thermally conductive element is positioned between the thermoelectric devices and the substrate regions such that the thermoelectric devices thermally contact the substrate regions through the thermally conductive element.

17. The module of claim 16, wherein the thermally conductive element comprises a plate.

18. The module of claim 15, wherein the control means comprises:

a) a plurality of variable power supplies in electrical contact with the thermoelectric devices; and b) a controller in electrical contact with the variable power supplies and with the fluid valve, the controller having a processor programmed to cycle the substrate temperatures at the substrate regions in accordance with the process temperatures.

19. The module of claim 18, further comprising a plurality of temperature sensors in electrical contact with the controller for sensing the substrate temperatures at the substrate regions and for sending to the controller a plurality of sensor signals representative of the substrate temperatures, wherein the processor is programmed to adjust the variable power supplies in response to the sensor signals in order to control the substrate temperatures at the substrate regions.

20. The module of claim 19, wherein the processor is further programmed to adjust the fluid valve in response to the sensor signals in order to further control the substrate temperatures at the substrate regions.

21. The module of claim 19, wherein at least one of the temperature sensors is a thermocouple.

22. The module of claim 19, wherein at least one of the temperature sensors is an infrared sensor.

23. The module of claim 18, further comprising a plurality of scatterometers in electrical contact with the controller for sensing a plurality of substrate process parameters at the substrate regions and for sending to the controller a plurality of sensor signals representative of the substrate process parameters, wherein the processor is programmed to adjust the variable power supplies in response to the sensor signals in order to control the substrate process parameters at the substrate regions.

24. A thermal cycling module for thermally processing a material substrate, the module comprising:

a) a resistive heating element for thermally contacting a substrate region;

b) a power modulator in electrical contact with the resistive heating element for modulating a flow of electric current through the resistive heating element;

c) a heat exchanger in thermal contact with the resistive heating element, the heat exchanger having a passage for permitting fluid flow therethrough;

d) a fluid supply connected to the passage, wherein the fluid supply comprises a plurality of fluids having differing temperatures and a fluid valve for controlling relative amounts of flow of the fluids through the heat exchanger; and e) a controller connected to the power modulator and the fluid valve for cycling a substrate temperature at the substrate region between a first process temperature and a second process temperature.

25. The module of claim 24, further comprising a thermally conductive element for thermally contacting the substrate region, wherein the thermally conductive element is positioned between the resistive heating element and the substrate region such that the resistive heating element thermally contacts the substrate region through the thermally conductive element.

26. The module of claim 25, wherein the thermally conductive element comprises a plate.

27. The module of claim 24, further comprising a temperature sensor in electrical contact with the controller for sensing the substrate temperature at the substrate region and for sending to the controller a sensor signal representative of the substrate temperature, wherein the controller is programmed to adjust the power modulator in response to the sensor signal in order to control the substrate temperature at the substrate region.

28. The module of claim 27, wherein the controller is further programmed to adjust the fluid valve in response to the sensor signal in order to further control the substrate temperature at the substrate region.

29. The module of claim 27, wherein the temperature sensor comprises a thermocouple.

30. The module of claim 27, wherein the temperature sensor comprises an infrared sensor.

31. The module of claim 24, further comprising a scatterometer in electrical contact with the controller for sensing a substrate process parameter at the substrate region and for sending to the controller a sensor signal representative of the substrate process parameter, wherein the controller is programmed to adjust the power modulator in response to the sensor signal in order to control the substrate process parameter at the substrate region.

32. The module of claim 24, wherein the resistive heating element comprises a foil heater.

33. The module of claim 24, further comprising an additional heating element in thermal contact with the heat exchanger for providing bulk heating of the substrate.

34. The module of claim 24, wherein at least one of the fluids is a gas.

35. The module of claim 24, wherein at least one of the fluids is a liquid.

36. The module of claim 24, wherein the resistive heating element includes a plurality of heating zones for thermally contacting a plurality of corresponding substrate regions, the module further comprises a plurality of power modulators connected to the resistive heating element and the controller for modulating flows of electric current through the heating zones, and the controller is programmed to control a plurality of substrate temperatures at the substrate regions in accordance with a plurality of process temperatures.

37. The module of claim 36, further comprising a thermally conductive element for thermally contacting the substrate regions, wherein the thermally conductive element is positioned between the resistive heating element and the substrate regions such that the heating zones of the resistive heating element thermally contact the substrate regions through the thermally conductive element.

38. The module of claim 37, wherein the thermally conductive element comprises a plate.

39. The module of claim 36, further comprising a plurality of temperature sensors in electrical contact with the controller for sensing the substrate temperatures at the substrate regions and for sending to the controller a plurality of sensor signals representative of the substrate temperatures, wherein the controller is programmed to adjust the power modulators in response to the sensor signals in order to control the substrate temperatures at the substrate regions.

40. The module of claim 39, wherein the controller is further programmed to adjust the fluid valve in response to the sensor signals in order to further control the substrate temperatures at the substrate regions.

41. The module of claim 39, wherein at least one of the temperature sensors is a thermocouple.

42. The module of claim 39, wherein at least one of the temperature sensors is an infrared sensor.

43. The module of claim 36, further comprising a plurality of scatterometers in electrical contact with the controller for sensing a plurality of substrate process parameters at the substrate regions and for sending to the controller a plurality of sensor signals representative of the substrate process parameters, wherein the controller is programmed to adjust the power modulators in response to the sensor signals in order to control the substrate process parameters at the substrate regions.

44. A method for processing a substrate through a thermal cycle, the method comprising the following steps:
   a) transferring heat between the substrate and a thermoelectric device;
   b) exchanging heat between the substrate and a fluid heat exchanger;
   c) changing relative flows of a plurality of fluids through the fluid heat exchanger, wherein the fluids have differing temperatures;
   d) calculating a control signal based on a desired process parameter; and
   e) changing a flow of electric current through the thermoelectric device in accordance with the control signal.

45. The method of claim 44, wherein at least one of the fluids is a gas.

46. The method of claim 44, wherein at least one of the fluids is a liquid.

47. The method of claim 44, further comprising the step of calculating an additional control signal based on the desired process parameter, wherein the relative flows of the fluids are changed in accordance with the additional control signal.

48. The method of claim 44, further comprising the step of measuring a substrate temperature of a substrate region, wherein the calculating of the control signal is further based on the measured substrate temperature.

49. The method of claim 44, further comprising the step of measuring a process parameter of a substrate region, wherein the calculating of the control signal is further based on the measured process parameter.

50. The method of claim 44, further comprising the step of placing the substrate in thermal contact with a thermally conductive element, wherein the heat is transferred between the substrate and the thermoelectric device through the thermally conductive element.

51. The method of claim 44, wherein the thermoelectric device comprises a resistive heating element and the step of transferring heat between the substrate and the thermoelectric device comprises transferring heat from the resistive heating element to the substrate.

52. The method of claim 44, further comprising the steps of:
   a) transferring heat between the substrate and a plurality of thermoelectric devices;

b) calculating a plurality of control signals based on a plurality of desired process parameters; and c) changing flows of electric current through the thermoelectric devices in accordance with the calculated control signals.

53. The method of claim 52, further comprising the step of measuring a plurality of substrate temperatures of a plurality of substrate regions, wherein the calculating of the control signals is further based on the measured substrate temperatures.

54. The method of claim 52, further comprising the step of measuring a plurality of process parameters of a plurality of substrate regions, wherein the calculating of the control signals is further based on the measured process parameters.

* * * * *

UNITED STATES PATENT AND TRADEMARK OFFICE
CERTIFICATE OF CORRRECTION

PATENT NO. : 5,802,856
DATED : September 8, 1998
INVENTOR(S) : Schaper et al.

It is certified that error appears in the above-identified patent and that said Letters Patent is hereby corrected as shown below:

On the title page, item [56] insert

U. S. PATENT DOCUMENTS

| EXAMINER INITIAL | PATENT NUMBER | | | | | | | ISSUE DATE | PATENTEE | CLASS | SUBCLASS | FILING DATE IF APPROPRIATE |
|---|---|---|---|---|---|---|---|---|---|---|---|---|
| | 5 | 4 | 3 | 1 | 7 | 0 | 0 | 7/11/95 | Sloan | | | |
| | 5 | 4 | 1 | 8 | 8 | 8 | 5 | 5/23/95 | Hauser et al. | | | |
| | 5 | 4 | 3 | 6 | 1 | 7 | 2 | 7/25/95 | Moslehi | | | |
| | | | | | | | | | | | | |

Signed and Sealed this

Sixth Day of April, 1999

Attest:

Q. TODD DICKINSON

*Attesting Officer*   *Acting Commissioner of Patents and Trademarks*